(12) United States Patent
Mehrotra et al.

(10) Patent No.: US 6,352,900 B1
(45) Date of Patent: Mar. 5, 2002

(54) CONTROLLED OXIDE GROWTH OVER POLYSILICON GATES FOR IMPROVED TRANSISTOR CHARACTERISTICS

(75) Inventors: Manoj Mehrotra, Dallas; Jerry Che-Jen Hu; Amitava Chatterjee, both of Plano; Mark S. Rodder, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/618,404

(22) Filed: Jul. 18, 2000

Related U.S. Application Data

(60) Provisional application No. 60/148,901, filed on Aug. 13, 1999.

(51) Int. Cl.$^7$ ............................................. H01L 21/336
(52) U.S. Cl. ..................... 438/305; 438/303; 438/306; 438/514; 438/519; 438/527
(58) Field of Search ................................. 438/305, 303, 438/306, 279, 514, 519, 522, 527; 257/316, 336, 408

(56) References Cited

U.S. PATENT DOCUMENTS 5,439,838 A * 8/1995 Yang ........................... 438/258

* cited by examiner

Primary Examiner—Charles Bowers
Assistant Examiner—Hsien-Ming Lee
(74) Attorney, Agent, or Firm—Peter K. McLarty; W. James Brady, III; Frederick J. Telecky, Jr.

(57) ABSTRACT

A method for controlled oxide growth on transistor gates. A first film (40) is formed on a semiconductor substrate (10). The film is implanted with a first species and patterned to form a transistor gate (45). The transistor gate (45) and the semiconductor substrate (10) is implanted with a second species and the transistor gate (45) oxidized to produce an oxide film (80) on the side surface of the transistor gate (45).

13 Claims, 1 Drawing Sheet

CONTROLLED OXIDE GROWTH OVER POLYSILICON GATES FOR IMPROVED TRANSISTOR CHARACTERISTICS

This application claims benefit of Prov. No. 60/148,901 filed Aug. 13, 1999.

FIELD OF THE INVENTION

The invention is generally related to the field of MOSFET transistors and more specifically to a novel process to achieve controlled oxide growth over the polysilicon gate of a MOSFET transistor for improved transistor characteristics.

BACKGROUND OF THE INVENTION

The formation of a sidewall offset spacer on the transistor polysilicon gate before the source-drain extension implant is often required to ensure proper gate-to-drain overlap in deep sub-micron CMOS transistors for improved device performance. It is often possible to obtain low source and drain resistance (Rsd) and gate-to-drain capacitance (Cgd) by co-optimizing the depth of the source-drain extension region and the thickness of the offset spacer. There are however, a number of drawbacks in using offset spacers in deep submicron CMOS transistors. Primarily, the use of the spacer increases process complexity and process variation. The spacer is often formed by depositing oxide or nitride films followed by a spacer etch. These extra steps increase process complexity and manufacturing cost. In addition to process complexity, it is very difficult to control the thickness and uniformity of the less than 200 A thick oxide and nitride films during the deposition process. Any variation in the film thickness directly affects the depth of the source-drain extension region and can affect the effective gate length (Leff) of the transistor. The extremely short gate lengths present in deep submicron CMOS transistors (<0.1 um) make such variation in Leff unacceptable.

Recently, a heavy polysilicon gate re-oxidation process after the polysilicon gate etch process was proposed to replace the deposition and etch formation of the offset spacer. A polysilicon gate re-oxidation is required in a conventional CMOS process flow to repair the gate edge damage caused by the gate etch step. In a conventional CMOS process flow, the re-oxidation time and temperature were limited by the lateral oxidation of the gate oxide at the edge of the polysilicon gate. This lateral oxidation causes an increase in the gate oxide thickness and often results in the well known polysilicon "smile" effect. This increase in gate oxide thickness can greatly affect the submicron CMOS transistor performance. In this heavy polysilicon gate re-oxidation process approach, a nitrided gate oxide was used to minimize the polysilicon gate "smile" effect during the growth of about 200 A of oxide on the polysilicon gate during re-oxidation. This thick polysilicon oxide forms an offset spacer along the sidewall of the polysilicon gate. Using this approach, an offset spacer can be formed without much increase in the gate oxide thickness in the channel. This method also has better process uniformity and less process complexity than the spacer formed using film deposition and etch processes. Although this approach solves many problems related to spacer formation, it introduces another very serious problem. In this approach, a thick screen oxide of about 100 A was also grown on the semiconductor surface during the polysilicon re-oxidation. The presence of this thick screen oxide is undesirable for the shallow source-drain extension implant due to dopant loss in the screen oxide. This dopant loss results in a source-drain extension region depth that varies with the screen oxide thickness. These variations in the depth of the source-drain extension region can affect the effective gate length (Leff) of the transistor often rendering the transistor inoperable. In addition to the screen oxide thickness increase, the thick oxide film grown on the top surface of the polysilicon gate adds process complexity. In current submicron CMOS processes this oxide film has to be removed during processing. Additional thickness on top of polysilicon is such however that an addition oxide etch step has to be added for its removal. There is therefore a need for a method for sidewall spacer formation that is suitable for use in deep submicron CMOS transistors.

SUMMARY OF THE INVENTION

The instant invention is a method for forming sidewall structures on transistor gate structures. An embodiment of the invention comprises: providing a semiconductor substrate; forming a first film over said semiconductor substrate; implanting said first film with a first species; patterning said first film to form a transistor gate structure with a top surface and a plurality of side surfaces; implanting said transistor gate structure and said semiconductor substrate with a second species; and forming a dielectric film on said transistor gate structure wherein said dielectric film thickness on said top surface of said transistor gate structure and on silicon substrate is less than said dielectric film thickness on said plurality of side surfaces. A further embodiment comprises: providing a semiconductor substrate; forming a first film over said semiconductor substrate; implanting said first film with a first species; patterning said first film to form a transistor gate structure with a top surface and a plurality of side surfaces; incorporating nitrogen into said top surface of said transistor gate structure and said semiconductor substrate using remote plasma nitridation; and forming a dielectric film on said transistor gate structure wherein said dielectric film thickness on said top surface of said transistor gate structure is less than said dielectric film thickness on said plurality of side surfaces.

Figure 1A:
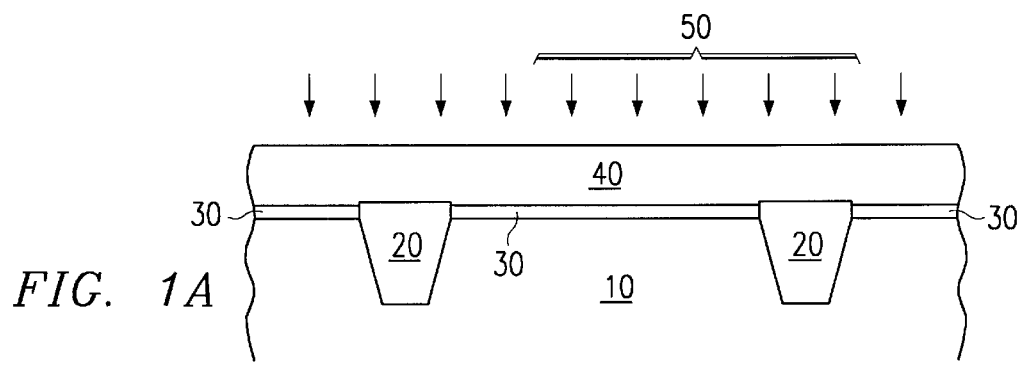
FIGS. 1A–1D are cross-sectional diagrams at various steps in an embodiment of the instant invention.

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIGS. 1A–1D, the instant invention can be utilized in any semiconductor device structure. The methodology of the instant invention provides a solution to obtaining controlled oxide growth for polysilicon gates for improved CMOS transistor performance.

The following description of the instant invention will be related to FIGS. 1A–1D. Referring to FIG. 1A, a semiconductor substrate 10 is provided and isolation structures 20 are formed in the substrate 10. These isolation structures can be formed using silicon oxide, silicon nitride, or any suitable dielectric material using the convention techniques of shallow trench isolation (STI) or local oxidation (LOCOS). Subsequent to the formation of the isolation structures 20, a gate dielectric 30 is formed on the surface of the substrate 10. This gate dielectric 30 may be comprised of an oxide, thermally grown SiO2, a nitride, an oxynitride, or any combination thereof, and is preferably on the order of 1 to 10 nm thick. A blanket layer of silicon containing material 40 (which will be patterned and etched to form the transistor gate structure) is formed on gate dielectric 20. Preferably, this silicon-containing material is comprised of polycrystalline silicon("poly" or "polysilicon"), but it may be comprised of epitaxial silicon or any other semiconducting material. Following the formation of the blanket layer 40, the blanket layer 40 is implanted with nitrogen 50 to a dose greater than $1\times10^{15}cm^2$ at energies less than 50 keV. This results in the high concentration on nitrogen in the upper surface of the blanket film 40 away from the gate dielectric 30. In addition to nitrogen, any inert species that would retard the oxidation rate could be used. This includes argon, fluorine, and helium. The doses of these species should be greater than $1\times10^{15}cm^2$ with energies that would depend on the penetration depth. The objective of the implant is to have a high species concentration close to the surface of the blanket layer 45.

Figure 1B:
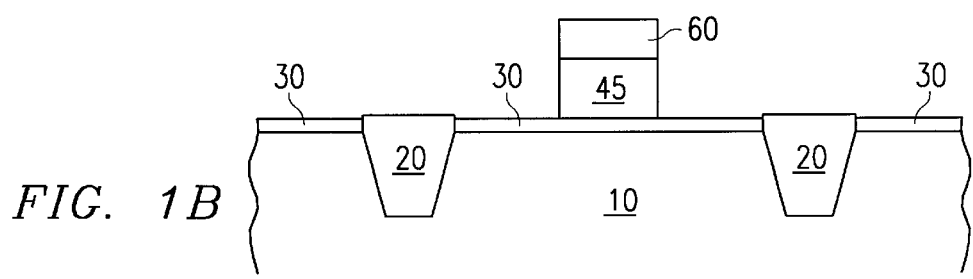
Figure 1C:
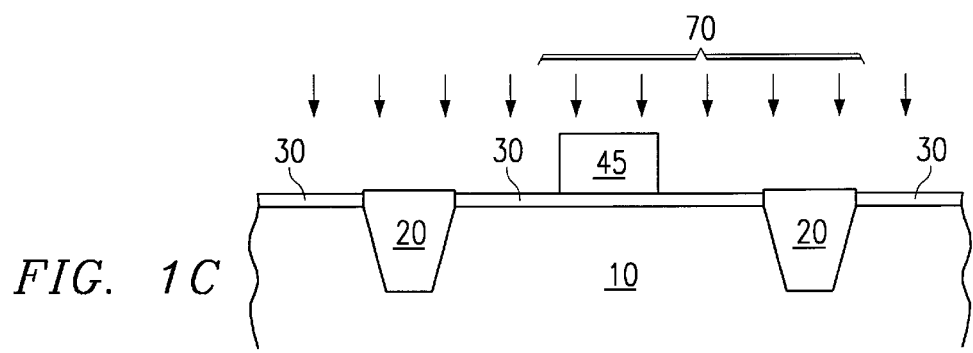

Illustrated in FIG. 1B is the structure of FIG. 1A after the gate pattern and etch processes. Firstly, a layer of photoresist is formed and patterned 60 to define the transistor gate electrode. Next a polysilicon gate etch process is used to remove portions of the blanket film 40 leaving the polysilicon gate shown in FIG. 1B. This polysilicon gate etch process may comprise a dry plasma process. As illustrated in FIG. 1C, after removal of the patterned photoresist film 60, the structure is subjected to a nitrogen implant process 70 at a dose of between $2\times10^{14}cm^2$ to $1\times10^{15}cm^2$ at energies less than 50 keV. This nitrogen implant will introduce additional nitrogen in the gate polysilicon structure 45 as well as introduce nitrogen in the surface of the semiconductor substrate 10. In addition to nitrogen, any inert species that would retard the oxidation rate could be used. This includes argon, fluorine, and helium. The doses of these species should be greater than $1\times10^{15}cm^2$ with energies that would depend on the penetration depth. The objective of the implant is to have a high species concentration close to the surface of the gate structure 45 and the surface of the semiconductor substrate 10. In another embodiment, nitrogen in introduced into the gate polysilicon structure 45 and the semiconductor substrate 10 by subjecting the structure to remote plasma nitridation (RPN). The source of nitrogen for the plasma may be a nitrogen containing precursor such as $N_2$ or $NH_3$ or their mixture with each other or any other inert gas (He, Ar, etc.) or oxidizing gas (NO, $N_2O$, $O_2$, etc.). The plasma is preferably a high density plasma. The plasma may be generated by any one of a number of sources. For example, one of the following sources may be used: helicon; helical-resonator; electron-cyclotron resonance; or inductively coupled. The substrate 10 can be unbiased, in which case the ionized substances are accelerated by the plasma potential (on the order of 20 Volts) and then implanted into the gate polysilicon structure 45 and the semiconductor substrate 10. A bias can be applied to the substrate 10 to further accelerate the ions from the plasma and implant them deeper into the surface. Either a DC or RF bias may be applied to the substrate 10. As an example, the following process conditions may be used: plasma density between $1\times10^{10}$ to $1\times10^{12}$; nitrogen flow between 1 and 100 sccm; pressures on the order of 1 to 50 mTorr, temperature in the range of 77 K to 773 K; substrate bias in the range of 0 to 50 Volts; and a duration in the range of 10 to 60 seconds.

Figure 1D:
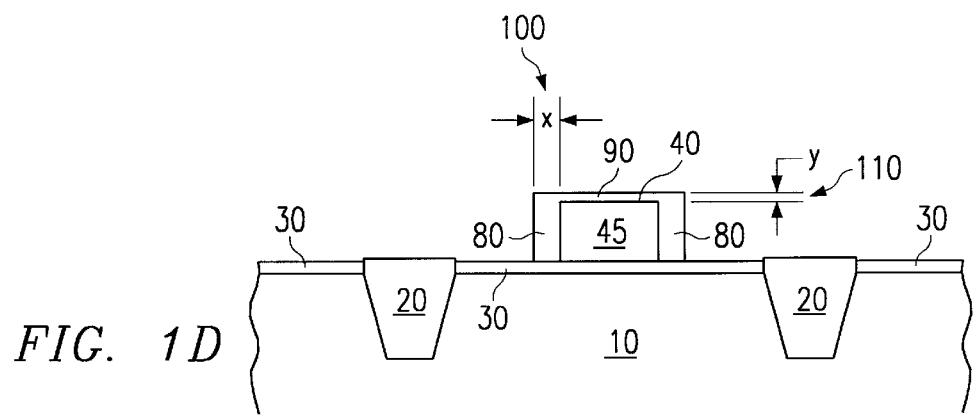

Illustrated in FIG. 1D is the structure of FIG. 1C after a polysilicon gate re-oxidation process. This re-oxidation process can comprise the thermal growth of an silicon oxide film or a silicon oxynitride film. In an embodiment of the instant invention, this can be accomplished by heating the structure in the presence of an oxidizing ambient. In another embodiment, this re-oxidation process could take place in the presence of a plasma. It is known in the art that the presence of nitrogen and other species will retard the oxidation rate of silicon during thermal and other oxidation processes. During the polysilicon gate re-oxidation process, the thickness denoted by the symbol x, 100, of the oxide formed on the sidewall of the polysilicon gate 80, will be greater than the thickness denoted by the symbol y, 110, of the oxide formed on the top surface of the polysilicon gate 90. This difference is due to the difference in oxidation rates of the side and top surfaces of the polysilicon gate 45. The oxidation rate of the top surface of the polysilicon gate 45 will be much less than the oxidation rate of the side surface due to the presence of nitrogen and/or other species at the top surface. The oxidation rate of the semiconductor substrate 10 will likewise be reduced due to the presence of nitrogen and/or other species at the surface. During the polysilicon gate re-oxidation process very little oxidation will occur in the semiconductor substrate 10 resulting in very little increase in the thickness of the dielectric film 30. The structure shown in FIG. 1D overcomes the limitations of the prior art by reducing oxide growth 90 on the top surface of the polysilicon gate 45 and the semiconductor substrate 10 while providing an adequate oxide sidewall spacer 80 for submicron CMOS transistor operation.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for controlled oxide growth on a transistor gate, comprising:

providing a semiconductor substrate;

forming a first film over said semiconductor substrate;

implanting said first film with a first species;

patterning said first film to form a transistor gate structure with a top surface and a plurality of side surfaces;

implanting said first film of said transistor gate structure and said semiconductor substrate with a second species; and forming a dielectric film on said transistor gate structure and on said semiconductor substrate wherein said dielectric film thickness on said top surface of said transistor gate structure and on said semiconductor substrate is less than said dielectric film thickness on said plurality of side surfaces.

2. The method of claim 1 wherein said first film is polycrystalline silicon.

3. The method of claim 1 wherein said first species is an element from the group consisting of nitrogen, argon, helium and fluorine.

4. The method of claim 1 wherein said implanting said first species comprises implanting said first species with an implant dose greater than $1\times10^{15}cm^2$.

5. The method of claim 1 wherein said second species is an element from the group consisting of nitrogen, argon, helium, and fluorine.

6. A method for forming a sidewall spacer, comprising:

providing a semiconductor substrate;

forming a first film over said semiconductor substrate;

implanting said first film with a first species;

patterning said first film to form a transistor gate structure with a top surface and a plurality of side surfaces;

incorporating nitrogen into said top surface of said transistor gate structure and said semiconductor substrate using remote plasma nitridation; and forming a dielectric film on said transistor gate structure wherein said dielectric film thickness on said top surface of said transistor gate structure is less than said dielectric film thickness on said plurality of side surfaces.

7. The method of claim 6 wherein said first film is polycrystalline silicon.

8. The method of claim 6 wherein said first species is an element from the group consisting of nitrogen, argon, helium and fluorine.

9. The method of claim 6 wherein said implanting said first species comprises implanting said first species with an implant dose greater than $1 \times 10^{15} cm^2$.

10. A method for controlled oxide growth on a transistor gate, comprising:

providing a semiconductor substrate;

forming a first film over said semiconductor substrate;

implanting said first film with a first species wherein said first species is an element from the group consisting of nitrogen, argon, helium and fluorine;

patterning said first film to form a transistor gate structure with a top surface and a plurality of side surfaces;

implanting said first film of said transistor gate structure and said semiconductor substrate with a second species; and forming a dielectric film on said transistor gate structure and on said semiconductor substrate wherein said dielectric film thickness on said top surface of said transistor gate structure and on said semiconductor substrate is less than said dielectric film thickness on said plurality of side surfaces.

11. The method of claim 10 wherein said first film is polycrystalline silicon.

12. The method of claim 10 wherein said implanting said first species comprises implanting said first species with an implant dose greater than $1 \times 10^{15} cm^2$.

13. The method of claim 10 wherein said second species is an element from the group consisting of nitrogen, argon, helium, and fluorine.

* * * * *